United States Patent

[11] 3,629,719

[72] Inventors Oscar Heller
Brooklyn, N.Y.;
John A. Chmiel, Linden, N.J.
[21] Appl. No. 852,166
[22] Filed Aug. 22, 1969
[45] Patented Dec. 21, 1971
[73] Assignee Bulova Watch Company, Inc.
New York, N.Y.

[54] DIFFERENTIAL AMPLIFYING SYSTEM
4 Claims, 1 Drawing Fig.

[52] U.S. Cl. ........ 330/69, 330/30 D
[51] Int. Cl. ........ H03f 2/00
[50] Field of Search ........ 330/69, 30 D

[56] References Cited
UNITED STATES PATENTS
3,445,780 5/1969 Beelitz ........ 330/69
3,453,554 7/1969 Shoemaker ........ 330/69 X

*Primary Examiner*—Nathan Kaufman
*Attorney*—Michael Ebert

ABSTRACT: A differential amplifying system in which two signal voltages are applied to respective positive inputs of a pair of high-gain operational amplifiers, each of whose output terminals is coupled by a negative feedback resistor to the negative input. The output terminals of the pair of amplifiers are connected to the two inputs on a third operational amplifier having a relatively low gain to produce a single-ended output voltage at the output terminal thereof, the system being characterized by a high common-mode rejection ratio, high differential voltage gain, and high-input impedance of equal magnitude at each input terminal.

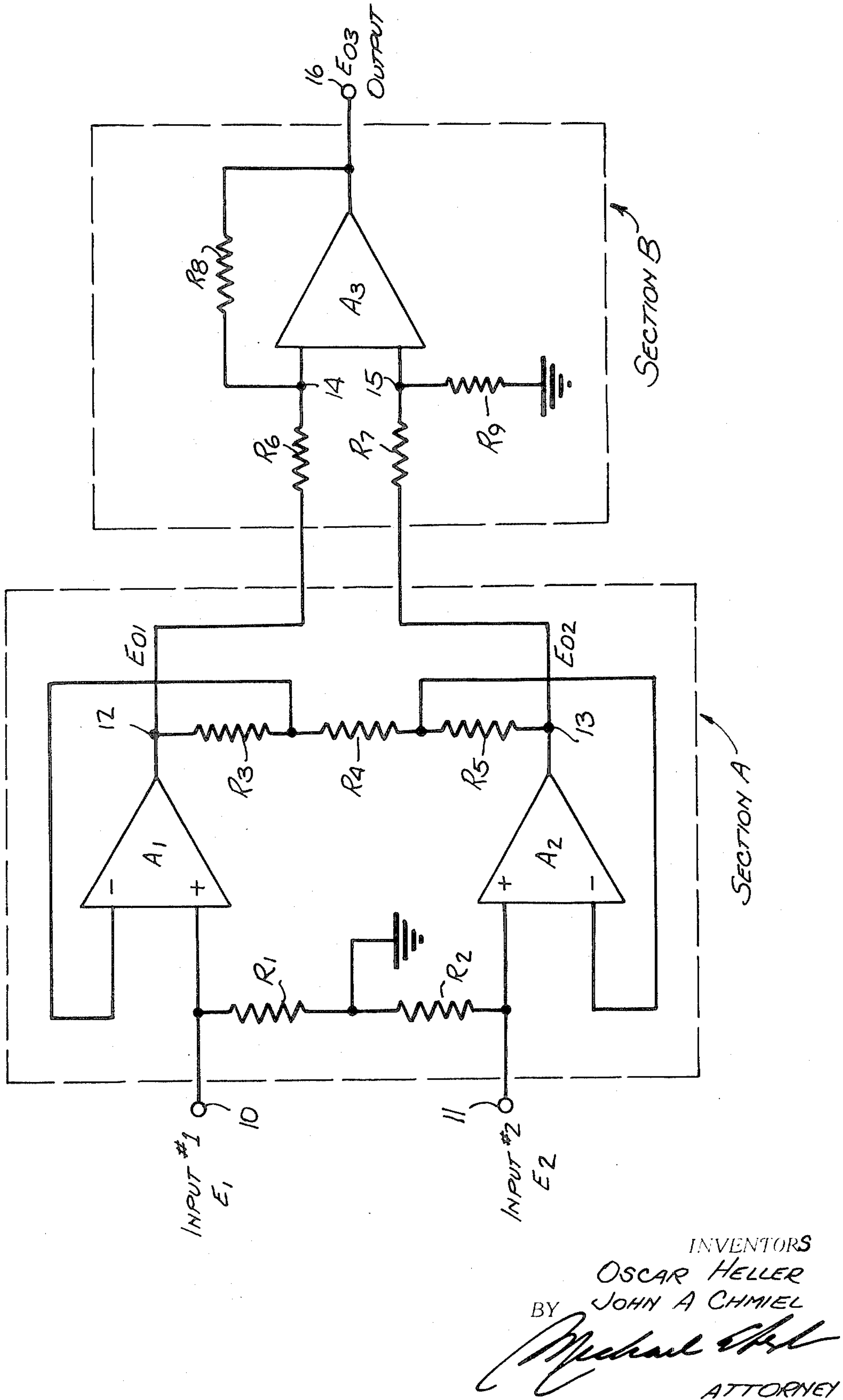
INVENTORS
OSCAR HELLER
JOHN A CHMIEL
BY
ATTORNEY

DIFFERENTIAL AMPLIFYING SYSTEM

BACKGROUND OF INVENTION

This invention relates generally to differential electronic amplifiers, and more particularly to an amplifying system having both a high common-mode rejection rate and a high differential voltage gain and a high input impedance.

Differential amplifiers provide an output which depends on the difference between the levels of two input signals. An important requirement of a differential amplifier is that it be able to discriminate against levels common to both inputs, while amplifying their difference. This ability to reject common levels is called common-mode rejection or CMR.

For example, in a solid-state differential amplifier one might have a low-frequency, AC signal riding on a DC level, this compound signal being applied to one base, with the same fixed base being applied to the other base. Care must be exercised to ensure that the response of the differential amplifier to the common DC level is low. It can be shown that the CMR of an externally balanced differential amplifier pair with equal source resistance can be expressed as:

$$CMR \cong V_{\mathrm{EE}}/V_{\mathrm{BE}}$$

where $V_{EE}$ is the equivalent voltage $I_E R_E$ and $E_{BE}$ is the difference between base-emitter voltages of the transistor.

There are many parameters which affect the drift of a differential amplifier. To minimize drift, matched characteristics are essential, but completely matched characteristics are not possible even on a pilot line basis. Moreover, an important factor contributing to drift is the change of collector current of voltage on a pair of transistors so that while the transistors may be perfectly matched at a given current or voltage level, the possibility exists that they will no longer be matched at a different level.

Various means are known to obtain a high common-mode rejection ratio in a conventional differential amplifier, but heretofore they could not be obtained in conjunction with precise differential voltage gain and high input impedance without the use of relatively high-resistance values in the amplifier circuit. Apart from the normal drawbacks incident to the use of high-resistance values, such values make it more difficult to effect matching, to minimize drift effect, and to maximize *CMR*.

BRIEF DESCRIPTION OF INVENTION

In view of the foregoing, it is the main object of this invention to provide a differential amplifying system having a high common-mode rejection ratio and a high differential voltage gain, and high input impedance, without the use of excessively high input values.

More specifically, it is an object of the invention to provide an amplifying system in which the two input signal voltages are separately amplified in a first section by a pair of high-gain operational amplifiers, each having negative feedback, the output of these amplifiers being applied as inputs to a single low-gain operation amplifier in a second section whose output yields the single-ended output signal proportional to the difference between the two input signals.

A significant advantage of the invention resides in the fact that the inverting and noninverting input signal terminals of this pair of amplifiers in the first section have equal circuit resistances, a feature precluded in conventional differential amplifier circuits. Moreover, the system makes it possible to minimize both offset voltage and offset current drift, by matching the drift characteristics of the pair of amplifiers in the final section and avoiding the necessity of using high-value input and feedback resistors.

Briefly stated, these objects are attained in a differential amplifying system including a first section constituted by a pair of operational amplifiers having a relatively high gain, and a second section including a single operational amplifier having a gain of one, the two input signal voltages being applied to the positive inputs of the pair of amplifiers, each of which includes a negative feedback between the respective output terminals and the negative input. The output terminals of the pair of amplifiers are connected to respective inputs of the amplifier in the second section to produce a single-ended signal voltage at the outlet terminal thereof.

BRIEF DESCRIPTION OF DRAWING

For a better understanding of the invention as well as other objects and further features thereof, reference is made to the following detailed description to be read in conjunction with the accompanying drawing whose single FIGURE is a schematic circuit diagram of a differential amplifying system in accordance with the invention.

DETAILED DESCRIPTION OF INVENTION

Referring now to the drawing, a differential amplifier system in accordance with the invention comprises two sections A and B. Section A includes a pair of operational amplifiers A1 and A2, while section B includes a single operational amplifier A3. Typically, the simplest operational amplifiers are constituted by two solid-state amplifier stages. This has become common practice, for it has been demonstrated mathematically that the most satisfactory stabilized building block consists of an amplifier with two active stages in that the available gain can be controlled most effectively and parasitic defects rendered less troublesome. The basic operational amplifiers in this form normally have differentially connected input stages, particularly when DC response is required.

In operational amplifiers A1 and A2 of section A, each amplifier has two input terminals, one of which is positive (+) and noninverting, the other being negative (−) and inverting. The output of each amplifier is considered to have a positive polarity.

The two input voltages applied to the system are designated by reference characters $E_1$ and $E_2$, voltage $E_1$ being impressed on the positive input of amplifier A1 at terminal 10 and voltage $E_2$ on the positive input of amplifier A2 at terminal 11. Connected in series between terminals 10 and 11 are input resistors R1 and R2, the junction thereof being grounded.

The output $E_{o1}$ of amplifier A1 appears at output terminal 12, while the output $E_{o2}$ of amplifier A2 is established at output terminal 13. Connected serially across output terminals 12 and 13 are resistors R3, R4 and R5. A negative feedback voltage is derived from the junction of resistors R4 and R5 and applied to the negative input amplifier A2. Thus amplifiers A1 and A2 of section A constitute parallel channels for the input signal voltages.

Section B is a standard differential amplifier circuit, one input for operational amplifier A3 being taken from output terminal 12 of amplifier A1 of section A and fed through resistor R6 to input terminal 14, the other input being taken from output terminal 13 of amplifier A2 and fed through input resistor R7 to terminal 15, this terminal going to ground through resistor R9. Feedback from the output of amplifier A3, which establishes an output voltage $E_{o3}$ at terminal 16, is through resistor R8 to input terminal 14. In the arrangement described herein, standard bias arrangements and frequency stabilizing components have been omitted to simplify the showing.

In the system shown in the FIGURE: the equations for the output of amplifiers A1, A2, and A3 are as follows:

$$E_{o1} = \left(1 + \frac{R_3}{R_4}\right) \times e_1 - \frac{(R_3)}{R_4} e_2 \qquad \text{(Eq. I)}$$

$$E_{o2} = \left(1 + \frac{R5}{R4}\right) \times e_2 - \frac{(R_5)}{R_4} e_1 \qquad \text{(Eq. II)}$$

$$E_{o3} = \frac{-R8}{R6}(E_{o1} - E_{o2}) - \frac{R8/R6}{2CMRR_{A3}}(E_{o1} + E_{o2}) \qquad \text{(Eq. III)}$$

Where $CMRR_{A3}$ is the inherent common-mode rejection ratio of operational amplifier A3:

$$E_{o3}=-\left(1+\frac{2R3}{R4}\right)\times(e_1-e_2)-\frac{e_1+e_2}{2CMRR_{A3}} \qquad \text{(Eq. IV)}$$

assuming R3=R5, R6=R8=R7=R9.

From equation IV, it will be evident that, $E_{o3}=(1+2R3/R4\ (e_1-e_2)$ if the following assumptions are made:

One, $R3=R5$, $R6=R7$ and $R8=R9$ (equality 1)

Two, $CMRR_{A3}>>1$ (assumption 1)

The differential voltage gain of section B, a conventional differential amplifier, is approximately equal to the ratio between input resistor R6 and feedback resistor R8. It will be evident that for high voltage gain, the ratio of the value of resistor R8 to that of resistor R6 must be much greater than unity. If, however, one requires an input impedance of 100 kΩ to realize a differential voltage gain of 1,000, the value of R8 would then have to be 100 M. ohms.

Inasmuch as the value of resistor R8 must be as close as possible to resistor R6 for good common-mode rejection, it would be necessary, as a practical matter, to closely match two wire-wound, 100 M. ohm. resistors. But this is very difficult if not impossible to accomplish in practice and is also quite costly. Thus the requisites for high gain are incompatible with the requisites for common-mode rejection.

Another point to be taken into consideration is that for an input impedance of 100 kΩ, both resistors R6 and R7 must have 1,000 kΩ values. But at such a high resistance level, the offset current drift requirement of solid-state operational amplifiers will about reach the limit of the present state of the art, to say nothing of other drawbacks of high input resistances.

These problems are obviated in section A which precedes differential amplifier section B, for the following reasons:

1. The desired differential voltage gain for the system can now be realized in section A and is only dependent upon the ratio of resistors R3/R4, with the common-mode gain being dependent (to a very good approximation) only on the equality of resistors R4 and R5. Since the low limit of resistors R3 and R5 will depend solely on the current swing capacity of amplifiers A1 and A2, a 10 kΩ choice for resistors R3 and R5 is more permissible. Moreover, since the voltage gain of the system is fully attained in section A, the only function of differential amplifier section B (A3, R6, R7, R8 and R9) is to convert a double-ended output ($E_{o1}$, $E_{o2}$) of section A into a single-ended output ($E_{o3}$). Section B, therefore, need not have a gain of more than one, thereby making it possible to equalize the values of resistors R6, R7, R8 and R9 and to give these resistors a low value, again only limited by the current swing capacity of amplifiers A1 and A2.
2. Having already obtained a common-mode rejection ratio which is equal to the gain of Section B, as shown in equation 4, resistors R6, R7, R8, R9 need no longer be matched to a very close tolerance. Moreover, the drift of amplifier A3 is now amplified only by a factor of one, so that the only drift of consequence is that encountered in amplifiers A1 and A2. Drift characteristics of amplifiers A1 and A2 can now be matched to minimize this effect.
3. Since both input signals are now applied to the "(+)" (noninverting) inputs of amplifiers A1 and A2, where the input resistance is high due to negative feedback, the input resistance will now be determined by the choices for resistors R1 and R2, assuming that Rin of the operational amplifier is much greater than R1, R2. It therefore becomes possible to realize equal input resistances for both input signals, whereas, if only circuit section B were used, the input resistance would be that of resistor R6 for one input, and that of the sum of resistors R6 and R9 for the other input if equality 1 is true.

Thus the addition of circuit section A to the conventional differential amplifier shown in circuit section B gives rise to the following advantages:

A. High differential gain and high common rejection ratio is attained using low-resistance values for resistors R3. R4, R5, R6, R7, R8 and R9.

B. These low-resistance values facilitate matching; they lower the cost of the system; and decrease offset current drift effects.

C. High input resistances and of equal value can now be realized for both input channels.

D. Drift may then be minimized by matching the drift characteristics of amplifiers A1 and A2 in section A.

While there has been shown and described a preferred embodiment of the invention, it will be appreciated that many changes and modifications may be made therein without, however, departing from the essential spirit of the invention.

What we claim is:

1. A differential amplifying system having a high common-mode rejection ratio and relatively high voltage gain without the use of excessively high-resistance values, said system comprising:

A. a first section having a gain greater than unity and constituted by parallel amplifying channels formed by a pair of relatively high gain operational amplifiers, each having a noninverting positive input, an inverting negative input, and an output terminal, means coupled to the output terminal of one of said amplifiers to derive a first negative feedback voltage therefrom and to apply to it the negative input thereof, and means coupled to the output terminal of the other amplifier to derive a second negative feedback voltage therefrom and to apply it to the negative input thereof, the second negative feedback voltage in said other amplifier balancing the first negative feedback voltage in said one amplifier whereby the amplifying channels are symmetrically arranged, said means to derive said first and second feedback voltages in said first section including a resistance element connected between the output terminals of the pair of amplifiers, the first feedback voltage being derived from a first tap on said element, the second feedback voltage being derived from a second tap thereon at a point in said resistance element producing feedback voltages of equal magnitude, B. a second section constituted by a differential amplifying channel having a single operational amplifier with unity gain and having a pair of input terminals and an output terminal, C. means connecting the respective output terminals of said first section to the pair of inputs of the second section, and D. means to apply input signal voltages to the positive inputs of the pair of amplifiers in the first section to produce an output signal voltage at the output terminal of the second section proportional to the difference of said two input signals.

2. A system as set forth in claim 1, wherein a center-tapped resistor is connected between the positive inputs of the pair of amplifiers of the first section, the center-tap being grounded.

3. A system as set forth in claim 1, wherein said output terminals of the first section are each connected through a resistor to respective inputs of the second station.

4. A system as set forth in claim 4, further including a resistance element connected between one input of said second section and the output terminal thereof, and a second resistance element connected between the other input of said second section and ground.

* * * * *